United States Patent [19]

Shimkunas

[11] Patent Number: 4,696,878
[45] Date of Patent: Sep. 29, 1987

[54] ADDITIVE PROCESS FOR MANUFACTURING A MASK FOR USE IN X-RAY PHOTOLITHOGRAPHY AND THE RESULTING MASK

[75] Inventor: Alexander R. Shimkunas, Palo Alto, Calif.

[73] Assignee: Micronix Corporation, Los Gatos, Calif.

[21] Appl. No.: 762,583

[22] Filed: Aug. 2, 1985

[51] Int. Cl.$^4$ .............................................. G03F 9/00
[52] U.S. Cl. ........................................ 430/5; 430/321; 430/296; 430/966; 378/35
[58] Field of Search .................. 430/5, 321, 966, 967, 430/296, 942; 378/34, 35; 204/15; 428/699, 701

[56] References Cited

U.S. PATENT DOCUMENTS

| | | | |
|---|---|---|---|
| 3,892,973 | 7/1975 | Coquin et al. | 250/505 |
| 3,925,677 | 12/1975 | Fraser | 250/505 |
| 4,018,938 | 4/1977 | Feder et al. | 427/43 |
| 4,302,316 | 11/1981 | Nester | 204/224 R |
| 4,328,298 | 5/1982 | Nester | 430/5 |
| 4,436,797 | 3/1984 | Brady | 430/5 |
| 4,451,544 | 5/1984 | Kawabuchi | 430/5 |
| 4,549,939 | 10/1985 | Kenworthy et al. | 204/4 |

FOREIGN PATENT DOCUMENTS 53-052073  5/1978  Japan .................................... 430/5

OTHER PUBLICATIONS

Maydan et al., "Boron Nitride Mask Structure for X-Ray Lithography", J. Vac. Sci Technol., 16(6), Nov./Dec. 1979, pp. 1959–1961.
Shimkunas, A. R., "Advances in X-Ray Mask Technology", Solid State Technology, Sep. 1984, pp. 192–199.
Georgiou et al., "DC Electroplating of Sub-Micron Gold Patterns on X-Ray Masks", SPIE, vol. 471 (1984), pp. 96–102.
Buckley, W. D. et al., "X-Ray Lithography Mask Technology", Solid State Science and Technology, May, 1981, vol. 128, No. 5, pp. 1116–1120.

Primary Examiner—John E. Kittle
Assistant Examiner—José G. Dees
Attorney, Agent, or Firm—Kenneth E. Leeds; Alan H. MacPherson; Paul J. Winters

[57] ABSTRACT

An additive process for manufacturing a mask (113) used in x-ray photolithography includes the step of coating a boron nitride layer (102) with a layer of indium tin oxide (104) and a second layer of boron nitride (106). The second boron nitride layer is patterend and used as a stencil during a plating process while the indium tin oxide layer is used as a plating base. Because boron nitride and thin indium tin oxide are both x-ray transparent, neither the stencil nor the plating base need be removed during the manufacturing process.

3 Claims, 13 Drawing Figures

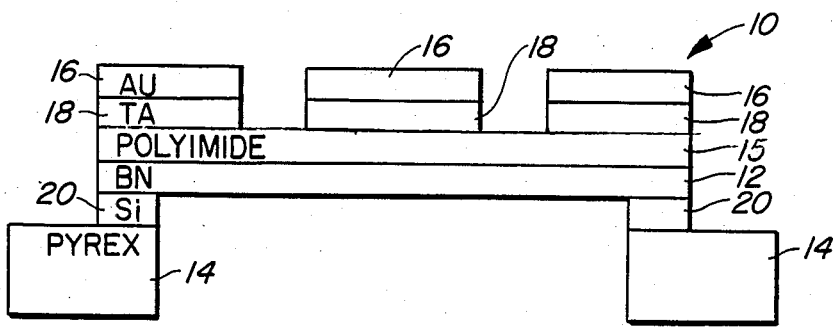
FIG._1.
(PRIOR ART)
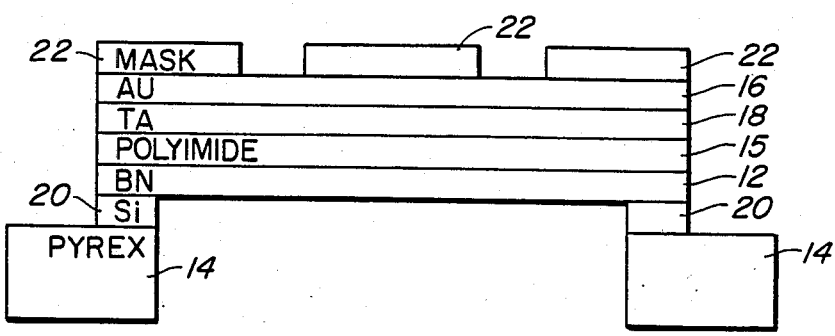
FIG._2a.
(PRIOR ART)
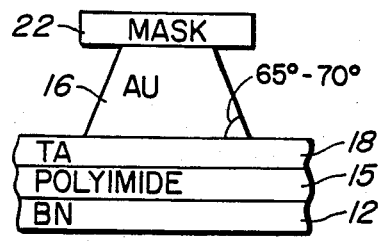
FIG._2b.
(PRIOR ART)
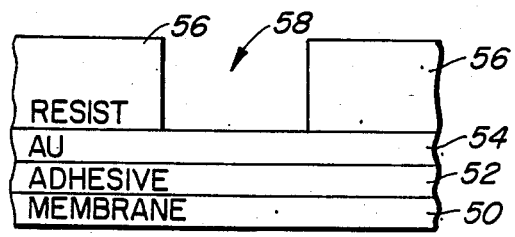
FIG._3a.
(PRIOR ART)
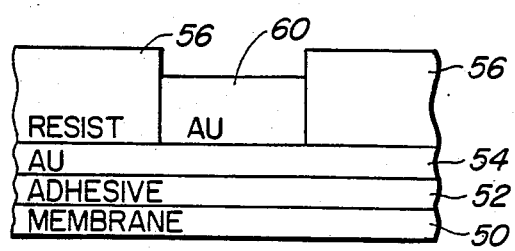
FIG._3b.
(PRIOR ART)
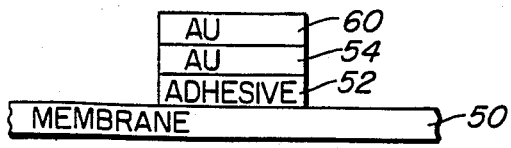
FIG._3c.
(PRIOR ART)

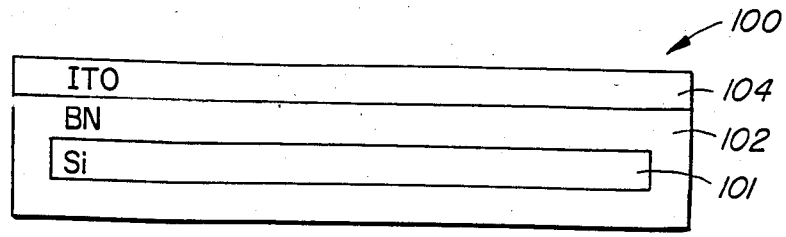
FIG._4a.
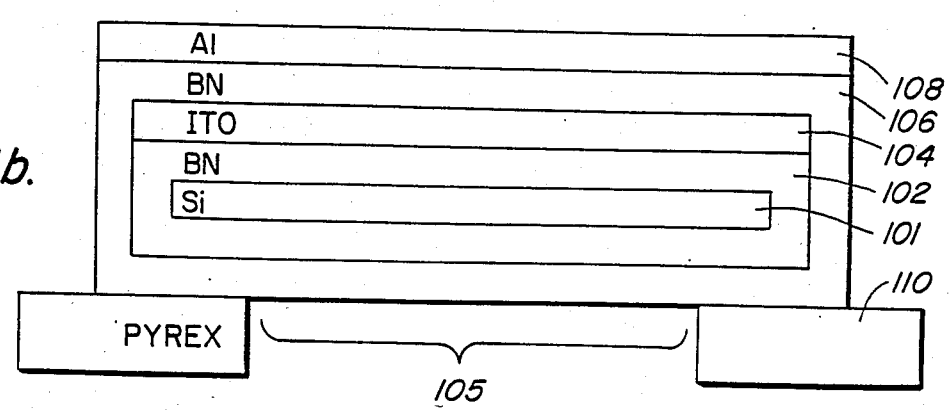
FIG._4b.
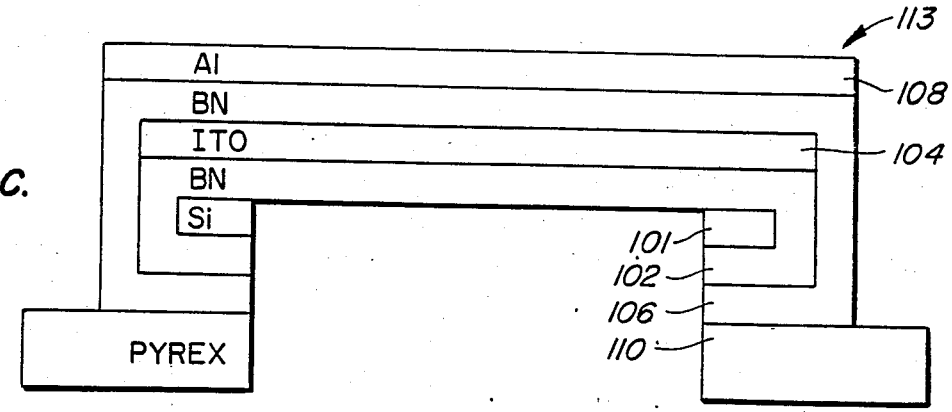
FIG._4c.
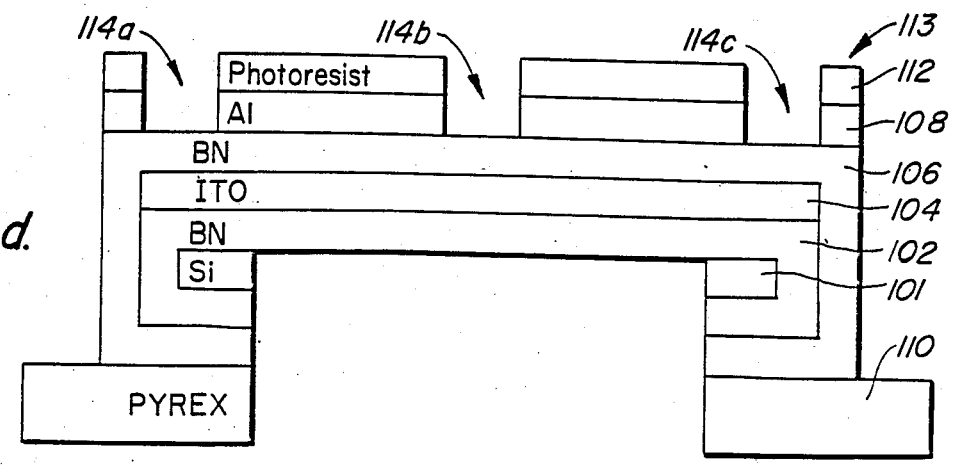
FIG._4d.

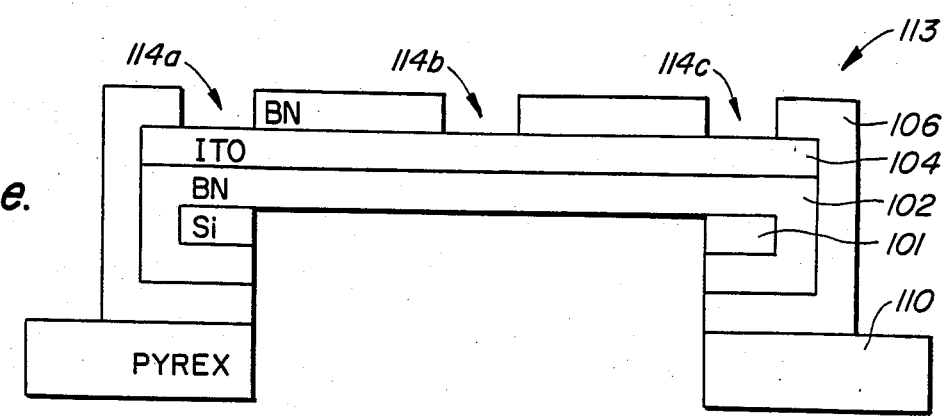
FIG._4e.
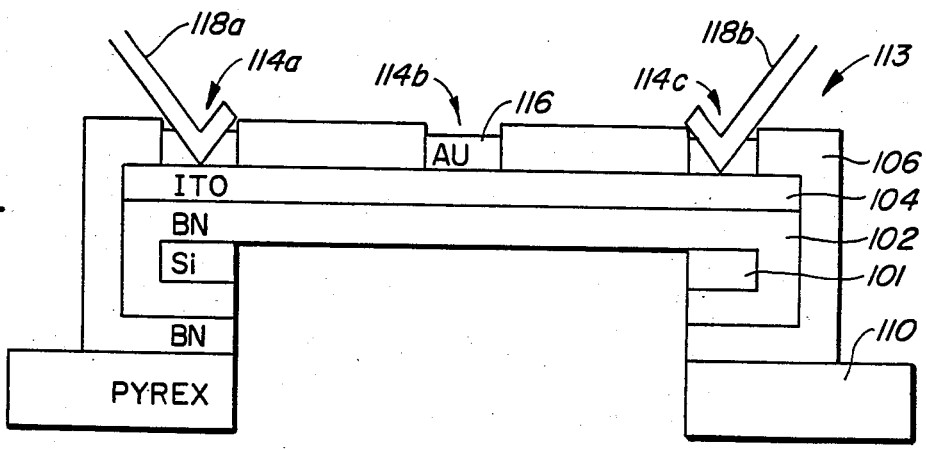
FIG._4f.
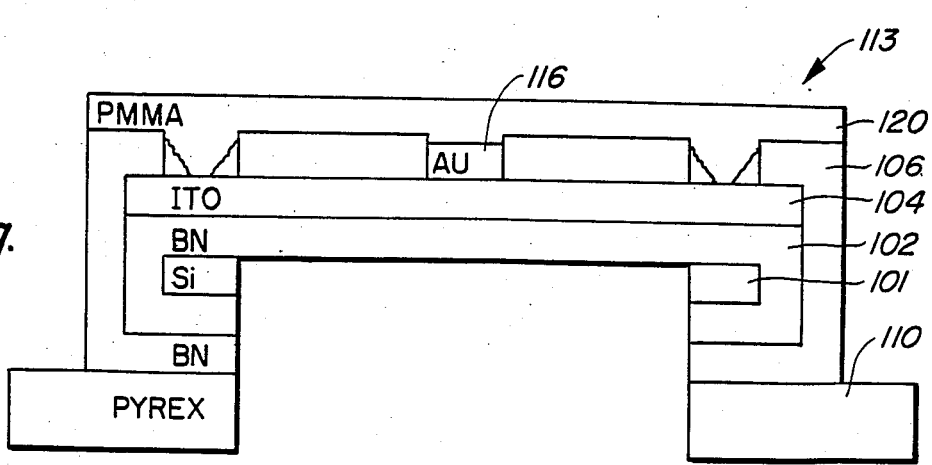
FIG._4g.

ADDITIVE PROCESS FOR MANUFACTURING A MASK FOR USE IN X-RAY PHOTOLITHOGRAPHY AND THE RESULTING MASK

BACKGROUND OF THE INVENTION

1. Field of the Invention

This invention relates to methods for manufacturing masks for use in x-ray photolithography and more specifically to methods for depositing an x-ray opaque material (such as gold) on a mask in accordance with a predetermined pattern.

2. Description of the Prior Art

It is known in the art to use masks in photolithographic processes for manufacturing integrated circuits. Processing a silicon wafer (which typically possesses a 4", 5" or 6" diameter) to obtain a given number of integrated circuits from the wafer is expensive. Because the smaller the integrated circuit, the more integrated circuits can be obtained from a wafer of given size, smaller integrated circuits are less expensive to fabricate than larger integrated circuits. It is also known in the art that there is a limit to the size of circuit structures that one can obtain by using photolithographic techniques with visible light. Accordingly, it has been suggested that radiation in the x-ray portion of the spectrum can be used in photolithographic manufacturing processes, e.g., as described in U.S. Pat. No. 3,743,842, issued to Smith et al. to obtain smaller integrated circuits. In processes using x-ray photolithography, it is necessary to provide masks which selectively block x-ray radiation.

Prior art masks (e.g., mask 10 of FIG. 1) used in x-ray photolithography typically include a boron nitride membrane 12 stretched across a pyrex ring 14. As is known in the art, boron nitride is transparent to x-rays. Boron nitride membrane 12 is covered with a polyimide layer 15. Deposited on polyimide layer 15 is a patterned gold layer 16 which is opaque to x-rays. A similarly patterned layer of tantalum adhesive 18 is provided between the gold and the polyimide to bond the gold to the polyimide. In addition, an intermediate layer of silicon 20 is bonded to both pyrex ring 14 and boron nitride layer 12.

Masks such as the one illustrated in FIG. 1 are typically produced in a subtractive fashion, i.e., a to-be-patterned mask as illustrated in FIG. 2a is provided in which boron nitride membrane 12 is completely covered with polyimide layer 15, tantalum layer 18, gold layer 16, and a mask layer 22, typically tantalum. Mask layer 22 is patterned, exposing regions of gold layer 16. The exposed regions of gold layer 16 are then etched away, typically by a sputter etching process, thus exposing regions of tantalum layer 18. Thereafter, the exposed regions of tantalum layer 18 are etched away and the remaining portions of mask layer 22 are removed, leaving patterned gold 16 adhering to polyimide layer 15 by means of intermediate similarly patterned layer of tantalum 18 (see FIG. 1). This process is discussed in greater detail in "Advances in X-Ray Mask Technology" by the inventor of the present invention, published in Solid State Technology in 1984.

This process is known to have several problems. Specifically, during the etching of gold layer 16, gold redeposits around the exposed edges of the patterned gold, causing the wall of the gold layer typically to have an angle of 65° to 70° with respect to the horizontal (see FIG. 2b). As is known in the art, the intensity of the x-rays reaching the area under the mask is inversely related to the thickness of the gold between the x-ray source and the photoresist being exposed by the x-rays. Because the thickness of the gold varies under the sloped edges, the edge definition of the structures being photolithographically produced using such a mask is degraded.

It is known in the art to provide masks for use in x-ray photolithography using an additive process in order to avoid the problem of sloped gold walls. In such processes, a structure including a membrane 50 (FIG. 3a) is coated with an intermediate adhesive layer 52 (e.g., tantalum), a thin gold layer 54, and a photoresist layer 56. Photoresist layer 56 is then patterned, forming window region 58, thus exposing a portion of gold layer 54. The mask is then subjected to a gold deposition process in which a gold layer 60 is deposited in window region 58 (FIG. 3b). Thereafter, the wafer is subjected to an etching process in which photoresist layer 56 is removed, exposing portions of gold layer 54. The exposed portions of gold layer 54 and the portion of adhesive layer 52 lying thereunder are then removed, leaving the structure of FIG. 3c. Such a process is described in a paper entitled "DC Electroplating of Sub-micron Gold Patterns on X-ray Masks", by G. E. Georgiou et al.

SUMMARY

In accordance with the present invention an additive process is provided for manufacturing a mask. According to this process, a first layer of an x-ray transparent material (typically boron nitride) is provided as a support for subsequently deposited x-ray opaque material. The first layer is then covered by a second layer of x-ray transparent material which is electrically conductive, and which subsequently serves as a plating base. The second layer is typically indium tin oxide.

The second layer is then covered with a third layer of x-ray transparent material (typically boron nitride) which is nonconductive. The third layer is then patterned, thus exposing regions of the second layer of material. An x-ray opaque substance (typically gold) is then deposited on the exposed regions of the second layer by a plating process. The resulting structure is a mask which is used without removing the second layer of material (the plating base) or the third layer of material (the stencil which defines the edges of deposited gold). Therefore, the process of the present invention is simpler and less expensive than prior art processes and introduces fewer defects in the mask. In addition, the remaining stencil helps block photoelectrons and Auger electrons emitted by the gold during x-ray exposure.

BRIEF DESCRIPTION OF THE DRAWING

FIG. 1 is an illustration of a prior art mask.

FIG. 2a is an illustration of a mask during a prior art subtractive manufacturing process.

FIG. 2b is an illustration of a mask constructed in accordance with a prior art process illustrating the slope of the gold wall on the mask.

FIGS. 3a through 3c illustrate a prior art additive mask manufacturing process.

FIGS. 4a through 4g illustrate in cross section a mask during the manufacturing process of the present invention.

DETAILED DESCRIPTION

An improved additive process in accordance with the present invention for building a mask for use in x-ray photolithography begins with forming an x-ray transparent layer (typically boron nitride) on a silicon wafer. A layer of x-ray transparent and electrically conductive material (in one embodiment indium tin oxide (ITO)), a second x-ray transparent layer (typically boron nitride) and a masking layer (typically aluminum) are formed over the boron nitride layer in the sequence. The second layer of boron nitride serves as a stencil and the ITO layer serves as a plating base during a subsequent plating process as will hereinafter become apparent. Thereafter, the silicon portion of the wafer is etched in a well known manner to leave a silicon ring which supports a boron nitride membrane coated by the ITO, second boron nitride, and aluminum layers.

A layer of photoresist is then deposited on the aluminum layer and patterned either by selective exposure to light or by a direct write E-beam. Desired portions of the photoresist layer are then removed, thus exposing portions of the aluminum layer. The pattern in the photoresist layer is then transferred to the aluminum layer to expose portions of the second boron nitride layer. The pattern in the aluminum layer is subsequently transferred to the second boron nitride layer to expose portions of the ITO layer. Thereafter, the photoresist layer and the aluminum layer are removed. An x-ray opaque material (typically gold) is then plated on the to-be-formed mask over the exposed ITO layer. The ITO layer, which is conductive, serves as a plating base and the second boron nitride layer serves as a stencil. The mask is then coated with a protective polymer such as PMMA. Thus, a mask is provided using an additive process. In accordance with one feature of the present invention because the stencil is x-ray transparent boron nitride and the plating base is x-ray transparent ITO, it is not necessary to strip the mask of the plating base and the stencil as in the prior art. Boron nitride is a particularly appropriate stencil material because of relative immunity to damage from x-ray radiation (e.g. it will not darken). Also, boron nitride is more rigid than a polymer, and therefore more capable of forming a fine line stencil with vertical walls.

Referring to FIG. 4a, the process in accordance with one embodiment of the present invention commences with coating both sides of a wafer 100 of silicon 101 with a layer of boron nitride 102. Silicon 101 is typically undoped or lightly doped. (Hereinafter, the term wafer is used to refer to silicon 101 and the substances formed thereon, either directly or indirectly.) In one embodiment of the invention, boron nitride layer 102 is approximately 3 to 5 microns thick and is deposited using a low pressure chemical vapor deposition process (LPCVD). Thereafter, one surface layer of boron nitride 102 is coated with a layer of indium tin oxide 104. In one embodiment of the invention, indium tin oxide (ITO) layer 104 is 600 Å thick and is provided either by sputtering or by evaporation in oxygen ambient. As will hereinafter become apparent, the layer of ITO 104 is used as a plating base during the mask manufacturing process. Of importance, a thin layer of ITO is transparent to visible light and x-ray radiaton. ITO is also electrically conductive.

Thereafter, the structure of FIG. 4a is coated with a second layer of boron nitride 106 (FIG. 4b). In one embodiment of the invention, boron nitride layer 106 is 1 micron thick and is deposited via an LPCVD process. As will hereinafter become apparent, boron nitride layer 106 serves as a stencil (i.e., defines the areas where an x-ray opaque material will not be plated) during a subsequent plating process. Thereafter, a 1,000 Å thick layer of aluminum 108 is sputtered onto a surface of boron nitride layer 106. The structure is then affixed to a pyrex ring 110 which serves as a mechanical support for the to-be-formed mask. Pyrex ring 110 can be affixed to boron nitride layer 106 via any of a number of techniques, e.g., an epoxy such as model number 353ND manufactured by Epoxy Technology.

A portion 105 of boron nitride layers 102 and 106 on the bottom of wafer 100 is then removed. In one embodiment, this is done by plasma etching. The boron nitride on the remainder of wafer 100 is protected by a thick photoresist backlap (not shown) such as Kodak surface protective resin model 650/MX936 or by a mechanical aluminum masking fixture. In other embodiments, portion 105 of boron nitride layers 102 and 106 on to-be-formed mask 113 is removed by a chemical etch (e.g., using sodium hypochlorite). Other etching methods can be used as well, such as using an air abrasive tool as described in U.S. patent application Ser. No. 06/761,998, entitled "Process for Manufacturing A Mask For Use in X-Ray Photolithography Using A Monolithic Support And Resulting Structure," on an invention by Alexander R. Shimkunas and James LaBrie, hereby incorporated by reference.

The step of etching boron nitride exposes a circular portion of silicon 101. The exposed portion of silicon 101 is then etched in any of a number of ways, e.g., by soaking mask 113 in a KOH solution, as described in U.S. patent application Ser. No. 758,596, filed July 23, 1985, entitled "Process for Making A Mask Used in X-Ray Photolithography" on an invention by Alexander R. Shimkunas, incorporated herein by reference. The resulting structure is illustrated in FIG. 4c. Of importance, the step of etching boron nitride layers 102 and 106 and silicon 101 can be performed at other points during the process of the present invention.

Thereafter, a layer of photoresist 112 is formed on aluminum layer 108. Referring to FIG. 4d, photoresist layer 112 is patterned by selective exposure to light or a direct E-beam write process. The exposed portions of photoresist layer 112 are then removed, leaving window regions 114a to 114c. The pattern in photoresist layer 112 is then transferred to aluminum layer 108. In one embodiment, this is done via a plasma etching process using a $BCl_3$ plasma at a pressure of 400 mTorr and a power of 50 watts.

Thereafter, the pattern is aluminum layer 108 is transferred to boron nitride layer 106. In one embodiment, this is done via a plasma etching process using 90% $CF_4$-10% $O_2$ as the process gas, a pressure of 15 mTorr and a power of 300 watts. During this process, the remainder of photoresist layer 112 is removed. Thereafter, the remainder of the aluminum layer 108 is removed, e.g., with a plasma etch using $BCl_3$ as the process gas. The remaining structure is illustrated in FIG. 4e. It will be appreciated that aluminum layer 108 is used in the process of the present invention because aluminum etches in a $BCl_3$ plasma but not in a $CF_4$ plasma. Also, because aluminum has a low atomic number, there are fewer electrons back-scattered during E-beam imaging than if a layer of a material with a higher atomic number were used.

Thereafter, the remaining structure is subjected to a gold plating process similar to the one described in U.S. patent applicatin Ser. No. 06/735,893 filed May 17, 1985 on an invention of Philip E. Mauger entitled "Additive Process for Manufacturing a Mask for Use in X-ray Photolithography", assigned to the same assignee as in this invention, and incorporated herein by referene. During this process, to-be-formed mask 113 is deposited in a conventional gold plating bath solution such as Model BDT-200 available from Sel-Rex. In one embodiment, the plating solution is about 45° C. An anode comprising platinum coated titanium is placed in the solution, and a voltage sufficient to generate a plating current of 1 to 5 mA/cm$^2$ is placed across the mask and the andoe. During this process, a gold layer 116 (FIG. 4f), typically 0.5 to 1μ thick, is deposited on the exposed portions of ITO layer 104. Of importance, windows 114a and 114c formed in boron nitride layer 106 permit an electrical potential to be applied to ITO layer 104 via metal leads 118a and 118b, respectively.

Thereafter, mask 113 is removed from the plating solution and coated with protective layer of PMMA 120 (FIG. 4g). (The gold in windows 114a and 114c is on the periphery of mask 113 and is not used when the mask is used in photolitographic processes.) Of importance, ITO layer 104 and boron nitride layer 106 are transparent to both visible light and x-rays. Therefore, in accordance with this invention, it is not necessary to remove the plating base and the stencil during the manufacturing process as is the case in the above-mentioned U.S. patent application Ser. No. 06/735,893 and the above-mentioned Georgiou paper. Accordingly, a mask constructed in accordance with the process of the present invention is simpler and less expensive to manufacture.

While the invention has been described with reference to a particular embodiment, those skilled in the art will recognize that minor changes can be made in form and detail without departing from the spirit and scope of the invention. For example instead of using ITO and boron nitride, other x-ray transparent substances can be used. In addition, instead of using ITO, a doped conductive boron nitride layer can be used. Accordingly, all such modifications come within the present invention.

I claim:

1. In a process for manufacturing a mask, the process steps of:
    providing an x-ray transparent visible light transparent plating base comprising indium tin oxide:
    providing a layer of a first material on said plating base, said first material being x-ray transparent, said first material comprising boron nitride;
    removing portions of said first material, thereby exposing portions of said plating base, the remaining portions of said first material serving as a stencil layer; and
    plating a layer of x-ray opaque material on said exposed portions of said plating base, wherein said step of removing portions comprises the steps of forming resist over said first material, said resist comprising photoresist or E-beam resist, patterning said resist, and transferring said pattern in said resist to said first material.

2. The process of claim 1 wherein said step of plating a layer comprises a gold plating process.

3. In a process for manufacturing a mask, the process steps of:
    providing a first layer of material, said first layer being x-ray transparent, said first layer comprising boron nitride;
    providing a second layer of material on said first layer, said second layer of material being electrically conductive, x-ray transparent and visible light transparent, said second layer comprising indium tin oxide;
    providing a third layer of material, said third layer being x-ray transparent and comprising boron nitride;
    providing a fourth layer of material on said third layer of material;
    removing portions of said fourth layer of material, thereby patterning said fourth layer of material;
    transferring the pattern in said fourth layer of material to said third layer of material, thus exposing portions of said second layer of material; and
    depositing an x-ray opaque substance on said exposed portions of said second layer of material, wherein said step of removing portions comprises the steps of forming resist over said forth layer, said resist comprising photoresist or E-beam resist, patterning said resist, and transferring said pattern in said resist to said forth layer.

* * * * *